(12) United States Patent
Nitsch (10) Patent No.: US 11,942,905 B2
(45) Date of Patent: Mar. 26, 2024

(54) METHOD FOR DETERMINING FILTER COEFFICIENTS AND EQUALIZER CIRCUIT

(71) Applicant: Rohde & Schwarz GmbH & Co. KG, Munich (DE)

(72) Inventor: Bernhard Nitsch, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/697,608

(22) Filed: Mar. 17, 2022

(65) Prior Publication Data
US 2022/0368289 A1 Nov. 17, 2022

(30) Foreign Application Priority Data

Apr. 29, 2021 (EP) ..................... 21171281

(51) Int. Cl.
*H03F 1/32* (2006.01)
(52) U.S. Cl.
CPC ......... *H03F 1/3247* (2013.01); *H03F 1/3258* (2013.01); *H03F 2201/3233* (2013.01)
(58) Field of Classification Search
CPC .............. H03F 1/3247; H03F 1/3258; H03F 2201/3233
USPC ...................................................... 375/296
See application file for complete search history.

(56) References Cited

U.S. PATENT DOCUMENTS 10,911,029 B1 * 2/2021 Velazquez ........... H03M 1/0626

OTHER PUBLICATIONS

Pan et al "Nonlinear Electrical predistortion and Equalization for Coherent Optical Communication Systems", Journal of Lightwave Technology, 29:18, Sep. 15, 2011, pp. 2785-2789 (Year: 2011).*
Crespo-Cadenas "A New Approach to Pruning Volterra Models for Power amplifiers" IEEE Transactions on Signal Processing, 58:14, Apr. 2010, pp. 2113-2120 (Year: 2010).*
Bussgang, J. J. et al., "Analysis of Nonlinear Systems with Multiple Inputs," Proceedings of the IEEE, 62:8; Aug. 1974, pp. 1088-1120.
Crespo-Cadenas, C. et al., "A New Approach to Pruning Volterra Models for Power Amplifiers," IEEE Transactions on Signal Processing, 58:4; Apr. 2010, pp. 2113-2120.
Evans, C. et al., "Periodic Signals for Measuring Nonlinear Volterra Kernels," IEEE Transactions on Instrumentation and Measurement, 45: 2, Apr. 1996, pp. 362-371.
Frank, Walter A., "Sampling Requirements for Volterra System Identification," IEEE Signal Processing Letters, 3:9; Sep. 1996, pp. 266-268.
Im, Sungbin, "A Fast Method of Discrete Third-Order Volterra Filtering," IEEE Transactions on Signal Processing, 44:9; Sep. 1996, pp. 2195-2208.
Koh, T and E. J. Powers, "Second-Order Volterra Filtering and Its Application to Nonlinear System Identification," IEEE Transactions on Acoustics, Speech, and Signal Processing, ASSP-33:6; Dec. 1985, pp. 1445-1455.

(Continued)

*Primary Examiner* — Kevin M Burd
(74) *Attorney, Agent, or Firm* — CHRISTENSEN O'CONNOR JOHNSON KINDNESS PLLC (57) ABSTRACT

A method of determining filter coefficients of an equalizer circuit for equalizing a non-linear electronic system is described. The equalizer circuit includes a Volterra filter circuit. Further, an equalizer circuit for equalizing a non-linear electronic system and an electronic device are described.

12 Claims, 3 Drawing Sheets

(56) References Cited

OTHER PUBLICATIONS

Kuech, F. and W. Kellermann, "Partitioned Block Frequency-Domain Adaptive Second-Order Volterra Filter," IEEE Transactions on Signal Processing, 53:2; Feb. 2005, pp. 564-575.

Pan, J. and C. Cheng, "Nonlinear Electrical Predistortion and Equalization for the Coherent Optical Communication System," Journal of Lightwave Technology, 29:18, Sep. 15, 2011, pp. 2785-2789.

Schetzen, Martin, "Theory of pth-Order Inverses of Nonlinear Systems," IEEE Transactions on Circuits and Systems, CAS-23:5, May 1976, pp. 285-291.

Shcherbakov, M., "A Recursive Algorithm of Digital Polynomial Filtering," 2020 Moscow Workshop on Electronic and Networking Technologies (MWENT); Penza State University, Russia, 2020, 5 pages.

Zhu, A. and T. J. Brazil, "An Overview of Volterra Series Based Behavioral Modeling of RF/Microwave Power Amplifiers," RF and Microwave Research Group, University College, Dublin, Ireland, IEEE 2006, 5 pages.

\* cited by examiner

METHOD FOR DETERMINING FILTER COEFFICIENTS AND EQUALIZER CIRCUIT

FIELD OF THE DISCLOSURE

Embodiments of the present disclosure generally relate to a method of determining filter coefficients of an equalizer circuit for equalizing a non-linear electronic system. Embodiments of the present disclosure further relate to an equalizer circuit for equalizing a non-linear electronic system, and to an electronic device.

BACKGROUND

Signal-processing electronic components may bear one or several different types of imperfections that cause unwanted distortions of output signals of the signal-processing electronic component.

In the state of the art, linear equalizers are known that are configured to remove such unwanted distortions. However, these equalizers only work correctly if the electronic component can be approximated to have a linear behavior with sufficient accuracy.

If the electronic component exhibits a non-linear behavior or if narrow precision limits are to be complied with, linear equalizers may not be sufficient to equalize the output signal of the electronic component.

Accordingly, there is a need to provide a possibility to equalize non-linear electronic systems.

SUMMARY

Embodiments of the present disclosure provide a method of determining filter coefficients of an equalizer circuit for equalizing a non-linear electronic system. The equalizer circuit comprises a Volterra filter circuit. In an embodiment, the method comprises the following steps:
  providing an input signal;
  processing the input signal by the non-linear electronic system, thereby obtaining an output signal;
  providing a first mathematical model, wherein the first mathematical model describes the non-linear electronic system in terms of a first Volterra series;
  providing a second mathematical model, wherein the second mathematical model describes the Volterra filter circuit in terms of a second Volterra series;
  determining reference transfer functions of the Volterra filter circuit by a Pth order inverse technique based on the first Volterra series; and
  determining filter coefficients of the Volterra filter circuit based on the determined reference transfer functions and based on the second Volterra series.

The method according to embodiments of the present disclosure is based on the idea to describe the non-linear electronic system in terms of the first Volterra series, and to describe the Volterra filter circuit in terms of the second Volterra series.

In general, Volterra series can be used to describe non-linear systems that are frequency-dependent and independent of a signal level.

In frequency domain, the first Volterra series may describe an overall transfer function of the non-linear electronic system. In time domain, the first Volterra series may describe an overall impulse response of the non-linear electronic system.

In frequency domain, the second Volterra series may describe an overall transfer function of the Volterra filter circuit. In time domain, the second Volterra series may describe an overall impulse response of the Volterra filter circuit.

Based on the mathematical models of the non-linear electronic system and of the Volterra filter circuit, the filter coefficients of the Volterra filter circuit can be derived such that non-linear distortions of the output signal are compensated by the Volterra filter circuit.

With the Pth order inverse technique, the reference transfer functions of the Volterra filter circuit are determined iteratively, namely order by order. Thus, the first order reference transfer functions are determined based on a first condition. Then, the second order reference transfer functions are determined based on a second condition and based on the first order reference transfer functions already determined. Finally, the third order reference transfer functions are determined based on a third condition and based on the first order reference transfer functions and the second order reference transfer functions already determined. In principle, further orders could also be determined by the Pth order inverse technique.

Alternatively, reference impulse responses of the Volterra filter circuit are determined iteratively by the Pth order inverse technique. Thus, the first order reference impulse responses are determined based on a first condition. Then, the second order reference impulse responses are determined based on a second condition and based on the first order impulse responses already determined. Finally, the third order reference impulse responses are determined based on a third condition and based on the first order reference impulse responses and the second order reference impulse responses already determined. In principle, further orders could also be determined by the Pth order inverse technique.

The reference transfer functions of the Volterra filter circuit may then be determined based on reference impulse responses by a Fourier transform.

The provided input signal may be a calibration signal that is used in order to calibrate the equalizer circuit or rather the Volterra filter circuit.

Accordingly, the input signal may have predefined and known properties, i.e. a known spectrum, known amplitudes and/or known phases.

The input signal may be received from an external electronic device, for example from a signal generator or from a device under test. Alternatively, the input signal may be generated by a further internal electronic component of the electronic system.

Therein and in the following, the term "non-linear electronic system" is understood to denote a single non-linear electronic component or a plurality of non-linear electronic components that are interconnected in an arbitrary manner.

According to an aspect of the present disclosure, an order of the first Volterra series and/or an order of the second Volterra series is, for example, smaller than or equal to three. It has turned out that a maximum order of three for the first Volterra series and/or for the second Volterra series yields a sufficient accuracy for the filter coefficients of the Volterra filter circuit. At the same time, restricting the maximum order to three reduces the numerical complexity and thus the necessary computing resources. In some embodiments, less hardware multipliers may be necessary when the maximum order is restricted to three.

According to a further aspect of the present disclosure, transfer functions of the non-linear electronic system are determined, for example, based on the input signal, the output signal, and the first Volterra series, wherein the reference transfer functions of the Volterra filter circuit are determined based on the determined transfer functions of the non-linear electronic system. More precisely, the reference transfer functions may be determined based on the transfer functions of the non-linear electronic system by the Pth order inverse technique.

Alternatively, impulse responses of the non-linear electronic system may be determined based on the input signal, the output signal, and the first Volterra series, wherein the reference transfer functions of the Volterra filter circuit are determined based on the determined impulse responses of the non-linear electronic system. More precisely, reference impulse responses of the Volterra filter circuit may be determined based on the impulse responses of the non-linear electronic system by the Pth order inverse technique. The reference transfer functions may then be determined based on reference impulse responses by a Fourier transform.

In an embodiment of the present disclosure, the filter coefficients of the Volterra filter circuit are determined based on the determined reference transfer functions via a least squares method. In other words, the filter coefficients may be determined such that a mean squared error of the output signal of the Volterra filter circuit is minimized.

In a further embodiment of the present disclosure, a cost functional is provided, wherein the cost functional describes a spectral error signal power in dependence of the reference transfer functions, and wherein the cost functional is minimized in order to determine the filter coefficients of the Volterra filter circuit. In other words, the filter coefficients may be determined such that the mean power of the spectral error signal (i.e. of the deviation of the actual output signal of the Volterra filter circuit from an optimal output signal) is minimized. In some embodiments, the cost functional may be minimized by a least squares technique.

According to a further embodiment of the present disclosure, the cost functional comprises a spectral weighting function. With the spectral weighting function, the spectral quality of the Volterra filter circuit can be controlled. In other words, the spectral quality of the Volterra filter circuit can be set to a desired value by choosing an appropriate spectral weighting function. It has turned out that a particular high equalization accuracy is achievable this way.

According to another aspect of the present disclosure, the reference transfer functions of the Volterra filter circuit are, for example, obtained by a Pth order inverse technique in frequency domain. In some embodiments, the Pth order inverse technique may be applied to the transfer functions of the non-linear electronic system. In other words, the reference transfer functions may be obtained directly by the Pth order inverse technique in frequency domain.

Alternatively, the reference transfer functions of the Volterra filter circuit are obtained by a Pth order inverse technique in time domain. More precisely, reference impulse responses are determined via the Pth order inverse technique applied to the impulse responses of the non-linear electronic system in time domain, and the reference transfer functions are determined based on the reference impulse responses by a Fourier transform.

In a further embodiment of the present disclosure, the filter coefficients of the Volterra filter circuit are pruned. Therein and in the following, the term "pruned" is understood to mean that several filter coefficients are set to zero. This way, the numerical complexity of determining the filter coefficients is reduced. Moreover, the equalization time needed by the Volterra filter circuit in order to equalize the output signal is also reduced.

If only filter coefficients of the main diagonal of the impulse responses of the Volterra filter circuit are non-zero, the second Volterra series may also be called a "memory polynomial". If only few diagonals of the impulse responses are non-zero, the second Volterra series may also be called an "extended memory polynomial".

According to another aspect of the present disclosure, the filter coefficients are pruned, for example, such that frequency superpositions are reduced. In non-linear systems, there may be a superposition of contributions from different input signal frequencies contributing to the same output signal frequency. Such ambiguities can occur within the same order of the Volterra series and/or across different orders of the Volterra series. For example, within the order m=2, all frequencies $\{-f_{in}/f_a, +f_{in}/f_a\}$ always superpose to give an output frequency of zero. Within the order m=3, the input frequencies $\{-f_{in,0}/f_a, +f_{in,0}/f_a, +f_{in,1}/f_a\}$ always yield an output frequency $f_{out}/f_a = f_{in,1}/f_a$. There is a certain freedom in putting some of the filter coefficients of the Volterra filter circuit to zero, thereby avoiding at least some of the frequency superpositions.

According to a further aspect of the present disclosure, the input signal is, for example, a multi-frequency signal, wherein the multi-frequency signal comprises several different signal components having a different predefined frequency, respectively, for example wherein the multi-frequency signal comprises at least three different signal components. In order to fully characterize a Volterra system of maximum order M=3, a minimum number $N_T=3$ of different signal components having different frequencies is required.

In some embodiments, the predefined frequencies are chosen such that frequency superpositions are reduced. More precisely, the predefined frequencies of the input signal are chosen such that only unavoidable frequency superpositions remain and there are no avoidable frequency superpositions. The correct input frequencies can, for example, be found by solving a corresponding optimization problem with an intelligent search technique.

Embodiments of the present disclosure further provide an equalizer circuit for equalizing a non-linear electronic system. The equalizer circuit comprises a Volterra filter circuit. Filter coefficients of the Volterra filter circuit are determined by any method described above.

Regarding the advantages and further properties of the equalizer circuit, reference is made to the explanations given above with respect to the method(s), which also hold for the equalizer circuit and vice versa.

The method(s) may be performed by the equalizer circuit at least partially.

In some embodiments, the method may be performed by an electronic device comprising the equalizer circuit, for example by the electronic device described below. Thus, the electronic device may be configured to calibrate itself by performing the method(s).

However, it is to be understood that a further external device may be used in order to perform the method(s).

In some embodiments, the first Volterra series is determined based on the input signal and the output signal. Accordingly, samples associated with the input signal and samples associated with the output signal may be determined in order to determine the first Volterra series.

Embodiments of the present disclosure further provide an electronic device, comprising an equalizer circuit described above.

Regarding the advantages and further properties of the electronic device, reference is made to the explanations given above with respect to the method, which also hold for the electronic device and vice versa.

According to an aspect of the present disclosure, the electronic device is established as, for example, at least one of a measurement instrument, a broad-band amplifier, an analog-to-digital converter, a digital-to-analog converter, and a signal generator. The equalizer circuit may respectively be configured to compensate non-linear distortions originating from external components of the electronic device and/or from internal components of the electronic device.

In some embodiments, in the case of the digital-to-analog converter and in the case of the signal generator, the equalizer circuit may be configured to pre-compensate non-linear distortions caused by the digital-to-analog converter or by the signal generator, respectively.

According to another aspect of the present disclosure, the electronic device is established, for example, as an oscilloscope. Alternatively, the electronic device may be established as any other type of measurement instrument, for example as a signal analyzer or as a vector network analyzer.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
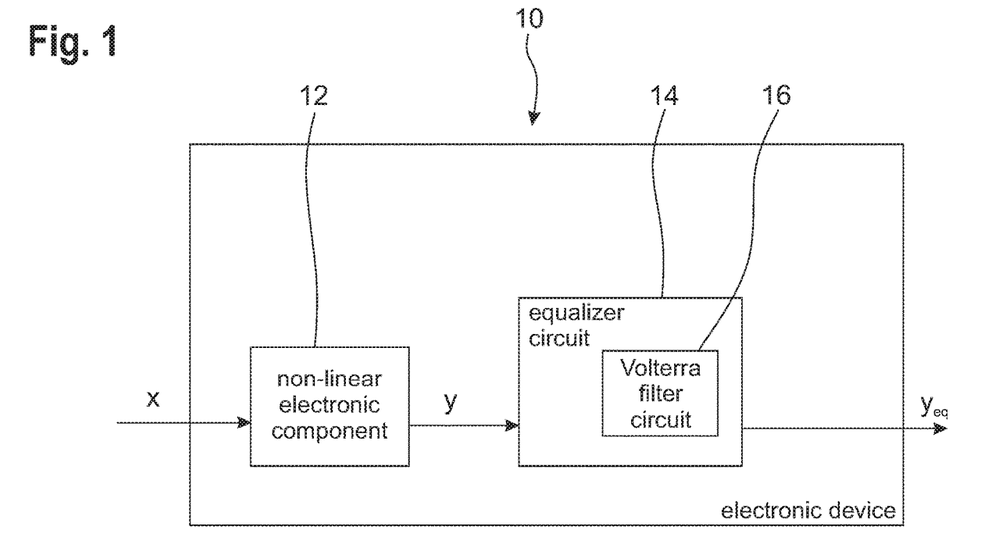
FIG. 1 schematically shows an electronic device according to a first embodiment of the present disclosure.

FIG. 1 schematically shows an electronic device 10. The electronic device 10 comprises a non-linear electronic component 12 and an equalizer circuit 14. In general, the electronic device 10 may be any kind of signal-processing electronic device or signal-generating electronic device. For example, the electronic device 10 may be established as a measurement instrument, as a broad-band amplifier, as an analog-to-digital converter, as a digital-to-analog converter, or as a signal generator. In some embodiments, the electronic device 10 may be established as an oscilloscope.

The non-linear electronic component 12 may be any electronic component that is configured to process an input signal x, thereby generating an output signal y. For example, the non-linear electronic component 12 may be an amplifier, an analog-to-digital converter, or a digital-to-analog converter.

Therein, the dependence of the output signal y on the input signal x is not linear, but comprises higher order terms. Accordingly, the output signal y is a function of the input signal x and can be written as follows $$y = A \cdot x + O(x^2),$$

i.e. as a linear term plus higher order terms. Therein, $y = (y(n=0), y(n=1), \ldots)^T$ is a vector comprising the output signal samples $y(n)$, and $x = (x(n=0), x(n=1), \ldots)^T$ is a vector comprising the input signal samples $x(n)$.

The non-linear terms may cause unwanted distortions of the output signal y.

In order to counteract these distortions, the equalizer circuit 14 is configured to equalize the output signal y, e.g. pre-distort a signal processed, such that the unwanted distortions are removed from the output signal y. For this purpose, the equalizer circuit 14 comprises, for example, a Volterra filter circuit 16 with filter coefficients that are adapted to remove the unwanted perturbations from the output signal y. The functionality of the Volterra filter circuit 16 will be described in more detail hereinafter.

Figure 2:
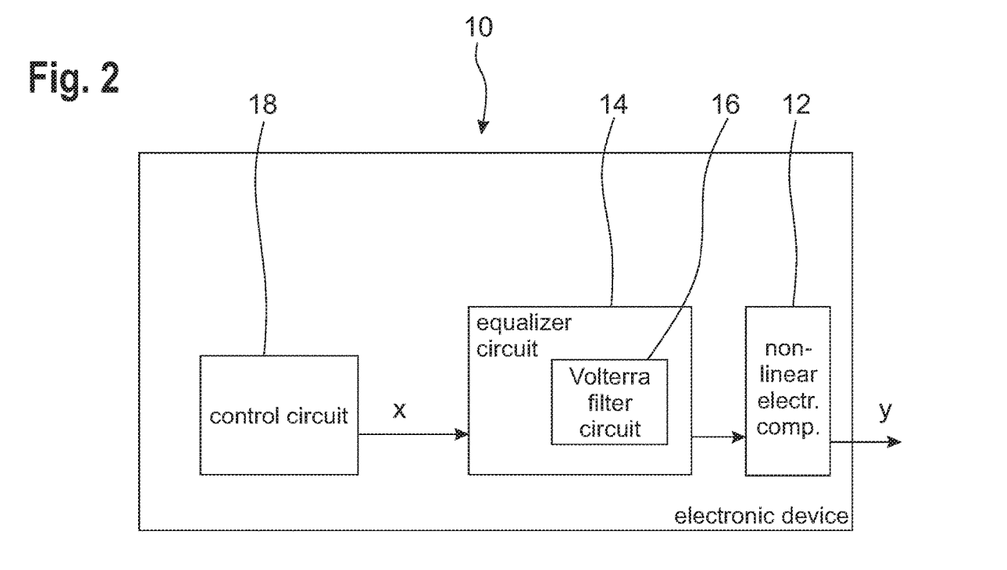
FIG. 2 schematically shows an electronic device according to a second embodiment of the present disclosure.

FIG. 2 schematically shows a second embodiment of the electronic device 10, wherein the electronic device 10 is established as a signal generator. For example, the electronic device 10 may be established as an arbitrary signal generator. Accordingly, the non-linear electronic component 12 may be established as any component being configured to generate a predetermined output signal y or to convert a digital input signal x to an analog output signal y.

The electronic device 10 comprises a control circuit 18 that is configured to generate the input signal x, wherein the input signal x comprises instructions for the electronic component 12 to generate the output signal y. The equalizer circuit 14 may be interconnected between the control circuit 18 and the non-linear electronic component 12.

Accordingly, the equalizer circuit 14 or the Volterra filter circuit 16 is configured to adapt the input signal x such that the output signal y does not comprise any non-linear distortions. In other words, the Volterra filter circuit 16 is configured to pre-compensate, also called pre-distort, the non-linear distortions that would be caused by the non-linear electronic component 12.

Alternatively, the electronic device 10 of FIG. 2 may be established as a digital-to-analog converter.

Accordingly, the equalizer circuit 14 or the Volterra filter circuit 16 is configured to adapt the digital input signal x such that the analog output signal y does not comprise any non-linear distortions. In other words, the Volterra filter circuit 16 is configured to pre-compensate the non-linear distortions that would be caused by the non-linear electronic component 12.

The equalizer circuit 14 needs to be properly calibrated, i.e. the filter coefficients of the Volterra filter circuit 16 need to be properly set, such that the Volterra filter circuit 16 correctly equalizes the output signal y.

The correct filter coefficients for the Volterra filter circuit can be obtained by a method of determining filter coefficients of the equalizer circuit 14. One example of the method is described in the following with reference to FIG. 3.

Without restriction of generality, the representative method is described in the following in the context of the electronic device 10 of FIG. 1. However, it is to be understood that the method can readily be adjusted for the electronic device 10 of FIG. 2.

Figure 3:
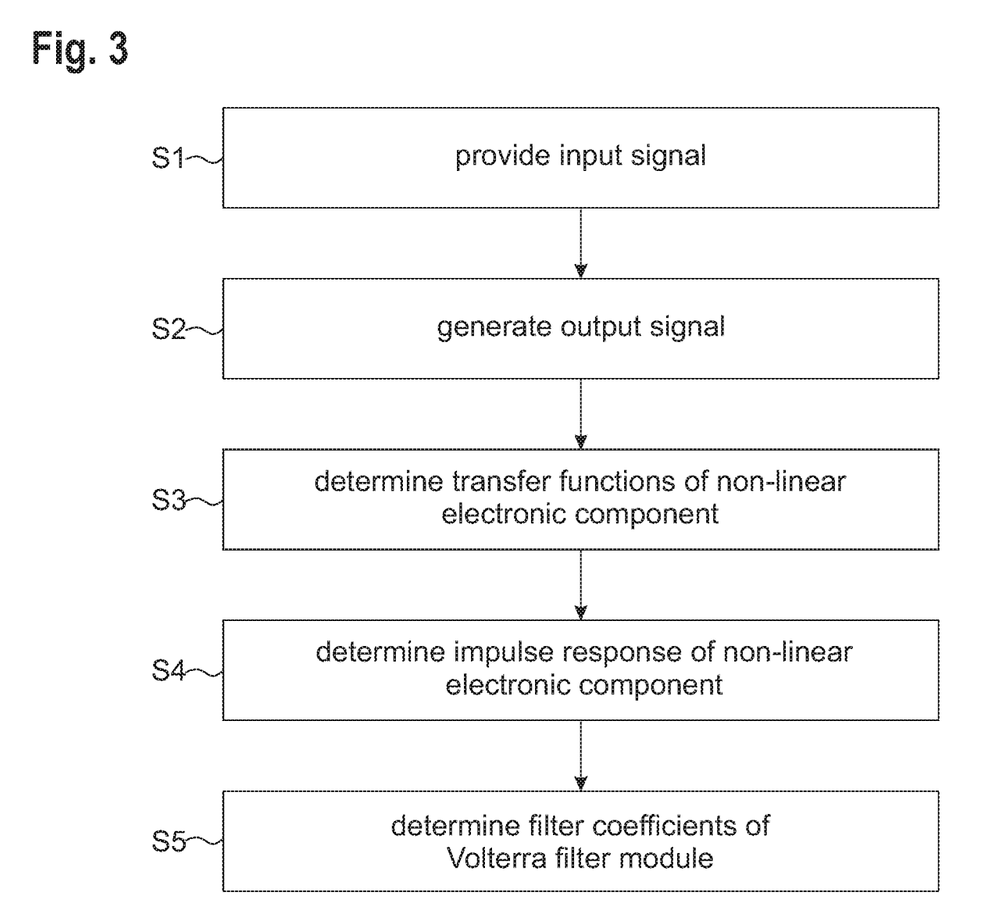
FIG. 3 shows an example of flowchart of a representative method of determining filter coefficients according to an embodiment of the present disclosure.

An input signal x is provided (step S1). In general, the input signal x is a calibration signal that is used in order to calibrate the equalizer circuit 14. Accordingly, the input signal x may have known properties, i.e. a known spectrum, known amplitudes and/or known phases.

The input signal x may be received from an external electronic device, for example from a signal generator or from a device under test. Alternatively, the input signal x may be generated by another internal electronic component of the electronic device 10.

The input signal x is processed by the non-linear electronic component 12, thereby generating the output signal y (step S2).

A first mathematical model is provided, wherein the first mathematical model describes the non-linear electronic component 12 in terms of a first Volterra series. In general, Volterra series can be used in order to describe non-linear systems that are frequency-dependent and independent of a signal level. The output signal y can then be written in terms of the input signal x as follows:

$$y(t/T_a) = \sum_{m=1}^{M} y_m(t/T_a) = \sum_{m=1}^{M} \sum_{\mu_0=0}^{L_{m,0}-1} \cdots \sum_{\mu_{m-1}=0}^{L_{m,m-1}-1} h_m(\mu_0, \ldots, \mu_{m-1}) \cdot \prod_{a=0}^{m-1} x(t/T_a - \mu_a) \quad (E.1)$$

Therein, M is the maximum order of the Volterra series, $h_m(\mu_0, \ldots)$ are multi-dimensional impulse responses, and $L_{m,\mu}$ is the length of the impulse response for the dimension $\mu$ and for the order m.

In other words, the non-linear electronic component 12 can be described as a Volterra filter, and may also be called Volterra system, wherein $L_{m,\mu}$ is the length of the Volterra filter of order m for the dimension $\mu$. This interpretation will be used in the following.

The filter coefficients $h_m(t_0/T_a, \ldots, t_{m-1}/T_a)$ of the Volterra system are ambiguous, as multiple filter coefficients lead to the same product signal $$x(t_0/T_a, \ldots, t_{m-1}/T_a) = \prod_{a=0}^{m-1} x(t_a/T_a) \quad (E.2)$$

in equation (E.1). Therein, $T_a$ is the sampling time associated with the input signal x, i.e. $f_a = 1/T_a$ is the sampling frequency of the input signal x.

For example, the filter coefficients $$\{h_2(t_0/T_a, t_1/T_a), h_2(t_1/T_a, t_0/T_a)\} \quad (E.3)$$

of a Volterra system of order m=2 yield the same product signal $x(t_0/T_a, t_1/T_a)$. Likewise, the following filter coefficients of a Volterra system of order m=3 yield the same product signal $x(t_0/T_a, t_1/T_a, t_2/T_a)$:

$$\{h_3(t_0/T_a,t_1/T_a,t_2/T_a), h_3(t_2/T_a,t_0/T_a,t_1/T_a), h_3(t_1/T_a,t_2/T_a,t_0/T_a), h_3(t_2/T_a,t_1/T_a,t_0/T_a), h_3(t_1/T_a,t_0/T_a,t_2/T_a), h_3(t_0/T_a,t_2/T_a,t_1/T_a),\} \quad (E.4)$$

Accordingly, there is a certain freedom of choice when describing the non-linear electronic component 12 in terms of the Volterra series of equation (E.1).

In some embodiments, the ambiguous filter coefficients $h_m$ may be chosen such that only one coefficient of a set of ambiguous coefficients is non-zero. Alternatively, the ambiguous filter coefficients may be chosen to be all equal to each other, such that a transfer function of the Volterra system has an additional symmetry.

The Fourier transform of equation (E.1) yields the spectrum Y of the output signal Y:

$$Y(f/f_a) = \sum_{m=1}^{M} Y_m(f/f_a) = \sum_{m=1}^{M} \sum_{f_0/f_a=0}^{N-1} \cdots \sum_{f_{m-1}/f_a=0}^{a-1} H_m(f_0/f_a, \ldots, f_{m-1}/f_a) \cdot \prod_{a=0}^{m-1} X(f_a/f_a) \cdot \delta_1(f/f_a - f_0/f_a - \ldots - f_{m-1}/f_a) \quad (E.5)$$

Therein, $$X(f/f_a) = \sum_{t/T_a=0}^{N-1} x(t/T_a) \cdot e^{-j \cdot 2\pi \cdot t/T_a \cdot f/f_a} \quad (E.6)$$

is the spectrum of the input signal x, and $$H_m(f_0/f_a, \ldots, f_{m-1}/f_a) = \sum_{t_0/T_a=0}^{N-1} \cdots \sum_{t_{m-a}/T_a=0}^{N-1} h_m(t_0/T_a, \ldots, t_{m-1}/T_a) \cdot e^{-j \cdot 2\pi \cdot (t_0/T_a \cdot f_0/f_a + \ldots + t_{m-a}/T_a \cdot f_{m-1}/f_a)} \quad (E.7)$$

is the transfer function of the Volterra system, i.e. the transfer function of the non-linear electronic component 12.

Moreover, N is the length of the Fourier transform, and $\delta_1(f/f_a)$ is a Kronecker-delta-operator, which operates with respect to its argument modulo 1:

$$\delta_1(f/f_a) = \delta(\mathrm{mod}\{f/f_a, 1\}). \quad (E.8)$$

Transfer functions of real-valued Volterra systems have a complex conjugate symmetry:

$$H_m(-f_0/f_a, \ldots, -f_{m-1}/f_a) = H^*_m(f_0/f_a, \ldots, f_{m-1}/f_a). \quad (E.9)$$

If the impulse responses $h_m(t_0/T_a, \ldots, t_{m-1}/T_a)$ are symmetric, then transfer functions of Volterra systems of order m=2 have the additional symmetry $$H_2(f_0/f_a, f_1/f_a) = H_2(f_1/f_a, f_0/f_a) \quad (E.10)$$

while the transfer functions of Volterra systems of order m=3 have the additional symmetry $$H_3(f_0/f_a,f_1/f_a,f_2/f_a)=H_3(f_2/f_a,f_0/f_a,f_1/f_a)=H_3(f_1/f_a,f_2/f_a,f_0/f_a)=H_3(f_2/f_a,f_1/f_a,f_0/f_a)=H_3(f_1/f_a,f_0/f_a,f_2/f_a)=H_3(f_0/f_a,f_2/f_a,h_1/f_a) \quad (E.11)$$

In other words, the transfer functions are equal to each other at points where the individual frequencies $f_\mu/f_a$ are interchanged arbitrarily.

From equation (E.5) it can be seen that the sampling rate $f_a$ associated with the input signal x is sufficient to characterize the non-linear electronic component 12 as a Volterra system. Accordingly, the sampling rate does not need to be enhanced, e.g. via an interpolation.

If the input signal x is established as a multi-frequency signal comprising a number $N_T$ of different signal components having different predefined frequencies $f_\mu/f_a$, amplitudes $A_\mu$ and phases $\phi_\mu$, the input signal can be written as $$X(f/f_a) = \sum_{\mu=0}^{N_T-1} A_\mu \cdot e^{j\phi_\mu} \cdot [\delta_1(f/f_a - f_\mu/f_a) + \delta_1(f/f_a + f_\mu/f_a)] \quad \text{(E.12)}$$

In this case, the output signal spectrum Y is given by $$Y_m(f/f_a) = \sum_{\mu_0=0}^{N_T-1} - \sum_{\mu_{m-1}=0}^{N_T-1} H_m\left(\frac{f_{\mu_0}}{f_a}, \ldots, \frac{f_{\mu_{m-1}}}{f_a}\right)\prod_{a=0}^{m-1} A_{\mu_a} \cdot e^{j \cdot \sum_{\alpha=1}^{m} \phi_{\mu_\alpha}} \cdot \left[\delta_1\left(\frac{f}{f_a} - \sum_{a=0}^{m-1}\frac{f_{\mu_a}}{f_a}\right) + \delta_1\left(\frac{f}{f_a} - \sum_{a=0}^{m-1}\frac{f_{\mu_a}}{f_a}\right)\right]. \quad \text{(E.13)}$$

It is noted that the multi-dimensional impulse responses of some Volterra systems, for example of low-noise amplifiers, are weakly occupied, i.e. most of the components of the multi-dimensional impulse responses are equal to zero.

If only filter coefficients of the main diagonal of the impulse responses are non-zero, the Volterra series may also be called a "memory polynomial". If only few diagonals of the impulse responses are non-zero, the Volterra series may also be called an "extended memory polynomial":

$$y(t/T_a) = \sum_{m=a}^{M} y_m(t/T_a) = \sum_{m=a}^{M}\sum_{\mu_0=0}^{L-1}\sum_{\mu_1=\mu_0-D_{m,1}}^{\mu_0+D_{m,1}} \cdots \sum_{\mu_{m-1}=\mu_0-D_{m-1,m-1}}^{\mu_0+D_{m-1,m-1}} h_m(\mu_0, \ldots, \mu_{m-1})\cdot\prod_{a=0}^{m-1} x(T_a - \mu_a). \quad \text{(E.14)}$$

Therein, the term $2D_{m,\mu}+1$ describes the number of diagonals of the impulse response of the Volterra system of order m with respect to dimension $\mu$.

Based on the input signal x, the output signal y, and the first Volterra series, impulse responses and/or transfer functions of the non-linear electronic component 12 are determined (step S3).

In the following, two different embodiments are described with respect to the input signal that both allow for determining the impulse responses and/or transfer functions of the non-linear electronic component 12.

It has turned out that restricting the analysis to the order M=3 is sufficient in both variants.

According to a first embodiment, the input signal x may be established as a broad-band noise signal.

Equation (E.1) can be rewritten in a matrix-vector-notation as follows:

$$\underline{y}(t/T_a) = \underline{X}(t/T_a)\cdot\underline{h}. \quad \text{(E.15)}$$

The vector $$\underline{h} = [h_1(0), \ldots, h_1(L_1-1), h_2(0,0), \ldots, h_2(L_{2,0}-1, L_{2,1}-1), h_3(0,0,0), \ldots, h_3(L_{3,0}-1, L_{3,1}-L_{3,2}-1)]^T \quad \text{(E.16)}$$

comprises all filter coefficients of the impulse responses of order m=1, 2, 3, wherein only one filter coefficient of each set of ambiguous filter coefficients is taken into account.

The matrix $$\underline{X}(t/T_a) = \begin{bmatrix} \underline{x}^T(t/T_a) \\ \vdots \\ \underline{x}^T(t/T_a \ldots N+1) \end{bmatrix} \quad \text{(E.17)}$$

comprises vectors $$\underline{x}(t/T_a) = [x(t/T_a), \ldots, x(t/T_a-L_1-1), x(t/T_a)\cdot x(t/T_a), \ldots, x(t/T_a-L_{2,0}+1)\cdot x(t/T_a-L_{2,1}+1), x(t/T_a) x(t/T_a)\cdot x(t/T_a), \ldots, x(t/T_a-L_{3,0}+1)\cdot x(t/T_a-L_{3,1}+1)\cdot x(t/T_a-L_{3,0}+1)]^T, \quad \text{(E.18)}$$

that comprise the corresponding product signals of the filter coefficients. The vector $$\underline{y}(t/T_a) = [y(t/T_a), \ldots, y(t/T_a-N+1)]^T \quad \text{(E.19)}$$

comprises the sample points of the output signal y of the non-linear electronic component 12.

In order to determine the impulse responses and/or transfer functions of the non-linear electronic component 12, a cost functional K is provided, wherein the cost functional K describes a mean error signal power:

$$K = \overline{e^2}(t/T_a) = [\underline{X}(t/T_a)\cdot\underline{h} - \underline{y}(t/T_a)]^T\cdot[\underline{X}(t/T_a)\cdot\underline{h} - \underline{y}(t/T_a)]. \quad \text{(E.20)}$$

The cost functional is minimized by the following choice of filter coefficients:

$$\underline{h} = [(\underline{X}^T(t/T_a)\cdot\underline{X}(t/T_a))]^{-1}\cdot[\underline{X}(t/T_a)\cdot\underline{y}(t/T_a)] \quad \text{(E.21)}$$

It is noted that the correlation matrix $$\underline{C}(t/T_a) = [\underline{X}^T(t/T_a)\cdot\underline{X}(t/T_a)] \quad \text{(E.22)}$$

needs to be inverted in order to determine the filter coefficients according to equation (E.21).

A broad-band noise signal comprises a lot of different frequencies. As can be seen in equation (E.13), several different signal components having different frequencies contribute to the same output signal frequency. In other words, there is a superposition of contributions from different input signal frequencies contributing to the same output signal frequency.

Such superpositions can occur within the same order m of the Volterra system and/or across different orders m of the Volterra system.

For example, within the order m=2, all frequencies $\{-f_{in}/f_a, +f_{in}/f_a\}$ always superpose to give an output frequency of zero. Within the order m=3, the input frequencies $\{-f_{in,0}/f_a, +f_{in,0}/f_a, +f_{in,1}/f_a\}$ always yield an output frequency $f_{out}/f_a = f_{in,1}/f_a$.

An example for such superpositions between different orders are input frequencies {0.15, 0.15} for m=2 and {0.1, 0.1, 0.1} for m=3, which both yield an output frequency of $f_{out}/f_a = 0.3$.

Thus, using a broad-band noise signal as input signal x leads to a systematically overdetermined computation problem.

It has turned out that the correlation matrix defined in equation (E.22) has a rather high condition, i.e. a high amplification factor of errors, which further complicates the matrix inversion.

Moreover, the correlation matrix comprises expectation values of higher order, namely $$r_x^o(T_0/T_a, T_1/T_a, \ldots, T_{o-1}/T_a) = E\left\{\prod_{\mu=0}^{o-1} x(t/T_a - T_\mu/T_a)\right\}. \quad (E.23)$$

More precisely, depending on the maximum order M of the Volterra system, the correlation matrix comprises expectation values of the orders $$o=\{2,3,\ldots,2M\} \quad (E.24)$$

These problems can be counteracted by enhancing the numeric precision for the matrix inversion and/or by enhancing the observation length N for determining the correlation matrix. However, this may considerably increase the necessary computation time.

According to a second embodiment, the input signal x may be established as a multi-frequency signal comprising a pre-defined number $N_T$ of signal components having different frequencies.

The output signal of the Volterra system then comprises spectral components having output frequencies $$f_{out,\alpha}/f_a = \mathrm{mod}\left\{\sum_{\mu=0}^{m-1} f_{in,\mu,\alpha}/f_a, 1\right\}, \quad (E.25)$$

which are generated by groups of m input frequencies $\{f_{in,0,\alpha}/f_a, \ldots, f_{in,m-1,\alpha}/f_a\}$, wherein frequencies within a group $\alpha$ may be partially or completely the same.

If the amplitudes and phases of the input signal x are known and the amplitudes and phases of the output signal y are determined, the transfer functions $H_m(\{f_{in,0,\alpha}/f_a, \ldots, f_{in,m-1,\alpha}/f_a\})$ can be determined at the spectral positions $\{f_{in,0,\alpha}/f_a, \ldots, f_{in,m-1,\alpha}/f_a\}$ of the frequency group $\alpha$.

As described above in the context of the input signal being established as a broad-band noise signal, different groups of input frequencies can contribute to the same output frequency.

Accordingly, several contributions associated with different transfer functions superpose, and the transfer functions may not be determinable at these spectral positions.

It has turned out that there are different classes of such ambiguities, namely the ambiguities originate within a single order m of the Volterra system;

the ambiguities originate across different orders m of the Volterra system;

the ambiguities are systematic, i.e. they cannot be avoided by choosing another set of input frequencies; and the ambiguities are non-systematic, i.e. they can be avoided by choosing another set of input frequencies.

Accordingly, the input frequencies of the input signal x are chosen such that only the systematic ambiguities remain and there are no non-systematic ambiguities. The correct input frequencies can, for example, be found by solving a corresponding optimization problem with an intelligent search technique.

It is noted that in order to fully characterize a Volterra system of maximum order M=3, a minimum number $N_T=3$ of different signal components having different frequencies is required.

The transfer functions $H_m$ of the Volterra system (i.e. of the non-linear electronic component 12)

$$H_m\left(\frac{f_0}{f_a}, \ldots, \frac{f_{m-1}}{f_a}\right) = \frac{c(m)}{N_{comb}(m, f_0/f_a, \ldots, f_{m-1}/f_a)} \cdot \frac{A_{out}(f_{out}/f_a)}{\prod_{\mu=0}^{m-1} A_{in}(f_\mu/f_a)} \cdot e^{j\cdot\phi_{iyt}(f_{out}/f_a) - j\cdot\sum_{\mu=0}^{m-1}\phi_{in}(f_\mu/f_a)} \quad (E.26)$$

at the spectral positions $\{f_0/f_a, \ldots, f_{m-1}/f_a\}$ depend on the amplitude $A_{out}(f_{out}/f_a)$ and the phase $\phi_{out}(f_{out}/f_a)$ of the output signal that are associated with the input frequencies $\{f_0/f_a, \ldots, f_{m-1}/f_a\}$.

Moreover, the transfer functions $H_m$ depend on the amplitudes $A_{in}(f_\mu/f_a)$ and the phases $\phi_{in}(f_\mu/f_a)$ of the components of the input signal x.

In equation (E.26), the factor c(m) is a scaling factor that depends on the order m, wherein c(1)=1, c(2)=2, and c(3)=4.

The factor $N_{comb}$ is a combinatorial factor, wherein:

$N_{comb}$(m=1)=1;

$N_{comb}$(m=2, $f_0/f_a$, $f_1/f_a$) is equal to 1 if $f_0=f_1$ and is equal to 2 otherwise; and $N_{comb}$(m=3, $f_0/f_a$, $f_1/f_a$, $f_2/f_a$) is equal to 1 if all frequencies are identical, equal to 3 if two frequencies are identical, and equal to 6 if all frequencies are different from each other.

It has turned out that the transfer functions $H_m$ determined according to equation (E.26) are symmetric, and the associated impulse responses $h_m$ are axisymmetric.

Put differently, the transfer functions $H_m$ are sampled with the multi-frequency input signal x.

In some embodiments, the individual signal components of the input signal x are non-equidistant in frequency domain, i.e. the value of $f_i-f_j$ is different for each pair of frequencies $f_i$, $f_j$ of the input signal.

In order to determine the transfer functions $H_m$ according to equation (E.26), the amplitudes $A_\mu$ and phases $\phi_\mu$ of the output signal y have to be determined.

The output signal y can be written as $$y(t/T_a) = \sum_{\mu=0}^{N_T-1} A_\mu \cdot \sin(2\pi \cdot f_\mu/f_a \cdot t/T_a + \phi_\mu) = \sum_{\mu=0}^{N_T-1} C_\mu \cdot \sin(2\pi \cdot f_\mu/f_a \cdot t/T_a) + D_\mu \cdot \cos(2\pi \cdot f_\mu/f_a \cdot t/T_a) \quad (E.27)$$

Equation (E.27) can be re-written in matrix-vector-notation as follows:

$$\underline{y}(t/T_a) = \underline{X}(t/T_a) \cdot \underline{h} \quad (E.28)$$

The vector $$\underline{h} = [C_0, D_0, C_1, D_1, \ldots, C_{N_T-1}, D_{N_T-1}]^T \quad (E.29)$$

comprises all amplitudes of the sine terms and of the cosine terms in equation (E.27). The matrix $$\underline{X}(t/T_a) = \begin{bmatrix} \underline{x}^T(t/T_a) \\ \vdots \\ \underline{x}^T(t/T_a - N + 1) \end{bmatrix} \quad (E.30)$$

comprises the vectors $$x(t/T_a) = [\sin(2\pi \cdot f_0/f_a \cdot t/T_a), \cos(2\pi \cdot f_0/f_a \cdot t/T_a), \ldots, \sin(2\pi \cdot f_{N_T-1}/f_a \cdot t/T_a), \cos(2\pi \cdot f_{N_T-1}/f_a \cdot t/T_a)]^T \quad (E.31)$$

which comprise the sample points associated with the sine terms and the cosine terms. N is the number of samples that is used for determining the amplitudes and phases. The vector $$\underline{y}(t/T_a) = [y(t/T_a), \ldots, y(t/T_a - N + 1)]^T \quad (E.32)$$

comprises the samples of the output signal y.

In order to determine the amplitudes $C_\mu$ and $D_\mu$, a cost functional K is provided, wherein the cost functional K describes a mean error signal power:

$$K = \overline{e}^2(t/T_a) \cdot [\underline{X}(t/T_a) \cdot \underline{h} - \underline{y}(T/T_a)]^T \cdot [\underline{X}(t/T_a) \cdot \underline{h} - \underline{y}(T/T_a)] \quad (E.33)$$

The cost functional is minimized by the following amplitude vector:

$$\underline{h} = [\underline{X}^T(t/T_a) \cdot \underline{X}(t/T_a)]^{-1} \cdot [\underline{X}^T(t/T_a) \cdot \underline{y}(t/T_a)] \quad (E.34)$$

The inverse of the correlation matrix $$\underline{X}^T(t/T_a) \cdot \underline{X}(t/T_a) \quad (E.35)$$

can be determined a priori, and may be saved in a memory for later usage.

The phases $\phi_\mu$ can then be determined from the equation $$\phi_\mu = \operatorname{atan}(D_\mu/C_\mu) \quad (E.36)$$

The amplitudes $A_\mu$ can then be determined according to the equation $$A_\mu = C_\mu / \sin(\phi_\mu) \quad (E.37)$$

There are two special cases at $f/f_a = 0$ and $f/f_a = -\frac{1}{2}$. In these cases, only the amplitude $A_\mu$ has to be determined. Thus, in these cases the parameter $D_\mu$ has to be set to zero in equations (E.27) and (E.29).

Optionally, the impulse responses $h_m$ of the non-linear electronic component 12 may be determined based on the determined transfer functions $H_m$ (step S4).

Equation (E.7) can be reformulated in matrix-vector notation as follows:

$$\underline{y} = \underline{X} \cdot \underline{h} \quad (E.38)$$

The vector $$\underline{h} = [h_m(0, \ldots, 0), h_m(L_m-1, \ldots, L_m-1)]^T \quad (E.39)$$

comprises all impulse responses of the non-linear electronic component 12 (the impulse responses may also be called filter coefficients of the Volterra system representing the non-linear electronic component 12). The reference vector $$\underline{y} = [H_m(f_0/f_a, \ldots, f_0/f_a), \ldots, H_m(f_{N-1}/f_a, \ldots, f_{N-1}/f_a)]^T \quad (E.40)$$

comprises the transfer functions $H_m$ of the non-linear electronic component 12, i.e. of the Volterra system. The matrix $$X = \begin{bmatrix} \underline{x}^T(f_0/f_a, \ldots, f_0/f_a) \\ \vdots \\ \underline{x}^T(f_{N-1}/f_a, \ldots, f_0/f_a) \end{bmatrix} \quad (E.41)$$

comprises vectors $$\underline{x}(f_0/f_a, \ldots, f_{m-1}/f_a) = [e^{-j \cdot 2\pi \cdot [f_0/f_a \cdot 0 + \ldots + f_{m-1}/f_a \cdot 0]}, \ldots, e^{-j \cdot 2\pi \cdot [f_0/f_a \cdot (L_m-1) + \ldots + f_{m-1}/f_a \cdot (L_m-1)]}]^T \quad (E.42)$$

that comprise the exponential functions of the respective Fourier transforms.

The following cost functional K is provided, wherein the cost functional K describes a mean spectral error signal power:

$$K = \overline{E}^2 = [\underline{X} \cdot \underline{h} - \underline{y}]^T \cdot \operatorname{diag}\{\underline{W}\} \cdot [\underline{X} \cdot \underline{h} - \underline{y}]. \quad (E.43)$$

Therein, the vector $$\underline{W} = [W(f_0/f_a, \ldots, f_0/f_a), \ldots, W(f_{N-1}/f_a, \ldots, f_{N-1}/f_a)]^T \quad (E.44)$$

is a spectral weighting function. Via the spectral weighting function, the spectral quality of the Volterra system can be controlled.

The cost functional K is minimized by the following filter coefficients (i.e. impulse responses) of the Volterra system:

$$\underline{h} = [\operatorname{diag}\{\underline{W}\} \cdot \underline{X}^T \cdot \underline{X}]^{-1} \cdot [(\operatorname{diag}\{\underline{W}\} \cdot \underline{X}^T \cdot \underline{y}] \quad (E.45)$$

It has turned out that the minimization problem defined by equations (E.38) to (E.45) is not ambiguous, and that the correlation matrix $$\operatorname{diag}\{\underline{W}\} \cdot \underline{X}^T \cdot \underline{X} \quad (E.46)$$

only has a small or moderate condition.

The inverse of the correlation matrix can be determined a priori, and may be saved in a memory for later usage.

The transfer functions $H_m$ do not have to be sampled in an equidistant manner. However, the maximum frequency distance puts an upper boundary on the length $L_m$ of the impulse response $h_m(t_0/T_a, \ldots, t_{m-1}/T_a)$:

$$L_m \leq \frac{1}{\max_{u,v}\{|f_\mu/f_a - f_\nu/f_a|\}} \quad (E.47)$$

It is noted that the minimization technique described in equations (E.38) to (E.47) can also be used for memory polynomials or otherwise pruned Volterra series. In that case, the impulse responses that are equal to zero have to be deleted from equation (E.39).

Filter coefficients of the Volterra filter circuit 16 are determined based on the determined transfer functions $H_m$ of the non-linear electronic component 12 (step S5).

In some embodiments, the filter coefficients of the Volterra filter circuit 16 are determined by a Pth order inverse technique, as will be described in more detail below.

In general, the Volterra filter circuit 16 is described by a second mathematical model, more precisely by a second Volterra series, analogously to equation (E.1).

First, the Pth order inverse technique will be described in time domain.

The filter coefficients $h_{eq,1}$ of order m=1 of the Volterra filter circuit 16 are defined by the following equation:

$$y(k) = \sum_{\mu_0} h_{eq,1}(\mu_0) \cdot \sum_{\alpha_0} h_1(\alpha_o) \cdot x(k - \mu_0 - \alpha_0) = x(k). \quad \text{(E. 48)}$$

Therein, $h_m(k_0, k_1, \ldots, k_{m-1})$ are the impulse responses of the Volterra system (i.e. of the non-linear electronic system 12) that have already been determined, while $h_{eq,m}$ are the desired impulse responses, i.e. the filter coefficients of the Volterra filter circuit 16.

In order for the output signal y(k) of the equalizer circuit 14 to be equal to the input signal x(k) of the non-linear electronic component 12, the condition $$\sum_{\mu_0} h_{eq,1}(\mu_0) \cdot h_1(-\mu_0) = 1 \quad \text{(E. 49)}$$

has to be fulfilled for $\mu_0 + \alpha_0 = 0$, while the condition $$\sum_{\mu_0} h_{eq,1}(\mu_0) \cdot h_1(D - \mu_0) = 0 \quad \text{(E. 50)}$$

has to be fulfilled for $\mu_0 + \alpha_0 = D \neq 0$. Equations (E.49) and (E.50) define a system of equations that can be solved by a minimum square error technique.

For the second order, i.e. m=2, the following condition has to be fulfilled:

$$\sum_{\mu_0}\sum_{\mu_1} h_{eq,2}(\mu_0, \mu_1) \cdot x(k-\mu_0) \cdot x(k-\mu_1) = \quad \text{(E.51)}$$

$$-\sum_{\alpha_0} h_{eq,1}(\alpha_0) \sum_{\beta_0}\sum_{\beta_1} h_2(\beta_0, \beta_1) \cdot$$

$$\left[\sum_{\gamma_0} h_{eq,1}(\gamma_0) \cdot x(k-\alpha_0-\beta_0-\gamma_0)\right] \cdot$$

$$\left[\sum_{\gamma_1} h_{eq,1}(\gamma_1) \cdot x(k-\alpha_1-\beta_1-\gamma_1)\right].$$

This leads to the following expression for the second order filter coefficients of the Volterra filter circuit 16:

$$h_{eq,2}(\mu_0, \mu_1) = -\sum_{\alpha_0} h_{eq,1}(\alpha_0) \cdot \quad \text{(E.52)}$$

$$\sum_{\beta_0}\sum_{\beta_1} h_2(\beta_0, \beta_1) \cdot h_{eq,1}(\mu_0 - \alpha_0 - \beta_0) \cdot h_{eq,1}(\mu_1 - \alpha_1 - \beta_1).$$

For the third order, i.e. m=3, the condition is that there should be no distortions of order m=3 at the output of the Volterra filter circuit 16. In a shortened notation, this condition can be expressed as $$Q_3 = K_1H_3 + K_2[H_1+H_2] - K_2H_1 - K_2H_2 - K_3H_1 = 0 \quad \text{(E.53)}$$

wherein $K_m$ represents the Volterra filter circuit 16 at order m, and wherein $H_m$ represents the Volterra system (i.e. the non-linear electronic component 12) at order m. $K_1$ and $K_2$ have already been determined above, cf. equations (E.50) and (E.52).

The third order contribution of the Volterra filter circuit 16 is then given by $$K_3 = -K_1H_3K_1 - K_2[H_1+H_2]K_1 + K_2H_1K_1 + K_2H_2K_1 = -K_1H_3K_1 - K_2[H_1+H_2]K_1 + K_2 + K_2H_2K_1 = T_{(1)} + T_{(2)} + T_{(3)} + T_{(4)}. \quad \text{(E.54)}$$

In the following, the explicit expressions for the terms $T_{(\mu)}$ are given:

$$T_{(1)} = -\sum_{\alpha_0} h_{eq,1}(\alpha_0) \cdot \quad \text{(E.55)}$$

$$\sum_{\beta_0}\sum_{\beta_1}\sum_{\beta_2} h_3(\beta_0, B_1, \beta_2) \cdot \left[\sum_{\gamma_0} h_{eq,1}(\gamma_0) \cdot x(k-\alpha_0-\beta_0-\gamma_0)\right] \cdot$$

$$\left[\sum_{\gamma_1} h_{eq,1}(\gamma_1) \cdot x(k-\alpha_0-\beta_1-\gamma_1)\right] \cdot \left[\sum_{\gamma_2} h_{eq,1}(\gamma_2) \cdot x(k-\alpha_0-\beta_2-\gamma_2)\right]$$

$$T_{(2)} = -\sum_{\alpha_0}\sum_{\alpha_1} h_{eq,2}(\alpha_0, \alpha_1) \cdot [x(k-\alpha_0) + T_{(5)}] \cdot [x(k-\alpha_1) + T_{(6)}]$$

$$T_{(5)} = \sum_{\beta_0}\sum_{\beta_1} h_2(\beta_0, \beta_1) \cdot$$

$$\left[\sum_{\gamma_0} h_{eq,1}(\gamma_0) \cdot x(k-\alpha_0-\beta_0-\gamma_0)\right] \cdot \left[\sum_{\gamma_1} h_{eq,1}(\gamma_0) \cdot x(k-\alpha_0-\beta_1-\gamma_1)\right]$$

$$T_{(6)} = \sum_{\beta_2}\sum_{\beta_3} h_2(\beta_2, \beta_3) \cdot$$

$$\left[\sum_{\gamma_2} h_{eq,1}(\gamma_2) \cdot x(k-\alpha_1-\beta_2-\gamma_2)\right] \cdot \left[\sum_{\gamma_3} h_{eq,1}(\gamma_0) \cdot x(k-\alpha_1-\beta_3-\gamma_3)\right]$$

$$T_{(3)} = +\sum_{\alpha_0}\sum_{\alpha_1} h_{eq,2}(\alpha_0, \alpha_1) \cdot x(k-\alpha_0) \cdot x(k-\alpha_1)$$

$$T_{(4)} = +\sum_{\alpha_0}\sum_{\alpha_1} h_{eq,2}(\alpha_0, \alpha_1) \cdot$$

$$\left[\sum_{\beta_0}\sum_{\beta_1} h_2(\beta_0, \beta_1) \cdot \left\{\sum_{\gamma_0} h_{eq,1}(\gamma_0) \cdot x(k-\alpha_0-\beta_0-\gamma_0)\right\} \cdot \right.$$

$$\left\{\sum_{\gamma_1} h_{eq,1}(\gamma_1) \cdot x(k-\alpha_0-\beta_1-\gamma_1)\right\}\right] \cdot$$

$$\left[\sum_{\beta_2}\sum_{\beta_3} h_2(\beta_2, \beta_3) \cdot \left\{\sum_{\gamma_2} h_{eq,1}(\gamma_0) \cdot x(k-\alpha_1-\beta_2-\gamma_2)\right\} \cdot \right.$$

$$\left.\left\{\sum_{\gamma_3} h_{eq,1}(\gamma_3) \cdot x(k-\alpha_1-\beta_3-\gamma_3)\right\}\right]$$

For the calculation of the impulse response $h_{eq,3}$ of the third order of the Volterra filter circuit 16, only product signals $x(k_0) \cdot x(k_1) \cdot x(k_2)$ with three sample values may contribute. It has turned out that terms that do not meet this condition completely cancel each other.

Accordingly, it holds $$-\sum_{\alpha_0}\sum_{\alpha_1} h_{eq,2}(\alpha_0, \alpha_1) \cdot T_{(5)} \cdot T_{(6)} = \quad \text{(E.56)}$$

$$-T_{(4)} - \sum_{\alpha_0}\sum_{\alpha_1} h_{eq,2}(\alpha_0, \alpha_1) \cdot x(k-\alpha_0) \cdot x(k-\alpha_1) = -T_{(3)}.$$

The result for the third order filter coefficients of the Volterra filter circuit 16 has two contributions, namely $h_{eq,3}^{(1)}$ and $h_{eq,3}^{(2)}$, which are given by $$h_{eq,3}^{(1)}(\mu_0, \mu_1, \mu_2) = \quad \text{(E.57)}$$

-continued $$-\sum_{\alpha_0} h_{eq,1}(\alpha_0) \cdot \sum_{\beta_0} \sum_{\beta_1} \sum_{\beta_2} h_3(\beta_0, \beta_1, \beta_2) \cdot h_{eq,1}(\mu_0 - \alpha_0 - \beta_0) \cdot$$

$$h_{eq,1}(\mu_1 - \alpha_0 - \beta_1) \cdot h_{eq,1}(\mu_2 - \alpha_0 - \beta_2)$$

$$h_{eq,3}^{(2)}(\mu_0, \mu_1, \mu_2) = -\sum_{\alpha_1}^{L_{eq,1}} h_{eq,2}(\mu_0, \alpha_1) \cdot$$

$$\sum_{\beta_2, \beta_3} h_2(\beta_2, \beta_3) \cdot h_{eq,1}(\mu_1 - \alpha_1 - \beta_2) \cdot h_{eq,1}(\mu_2 - \alpha_1 - \beta_3) -$$

$$\sum_{\alpha_0}^{L_{eq,1}-1} h_{eq,2}(\alpha_0, \mu_1) \cdot \sum_{\beta_0, \beta_1} h_2(\beta_0, \beta_1) \cdot h_{eq,1}(\mu_0 - \alpha_0 - \beta_0) \cdot h_{eq,1}(\mu_1 - \alpha_0 - \beta_1)$$

The third order filter coefficients of the Volterra filter circuit 16 are then given by $$h_{eq,3}(\mu_0,\mu_1,\mu_2) = h_{eq,3}^{(1)}(\mu_0,\mu_1,\mu_2) + h_{eq,3}^{(2)}(\mu_0,\mu_1,\mu_2) \quad (E.58)$$

With the same technique, filter coefficients $h_{eq,m}(k_0, k_1, k_2)$ of extended memory polynomials or pruned impulse responses can be determined. In this case, only sample times lying on the diagonals of the impulse responses $h_{eq,m}(k_0, k_1, k_2)$ are considered.

The determined impulse responses $h_{eq,m}(k_0, k_1, k_2)$ may not be the final filter coefficients for the Volterra filter circuit 16. Instead, the determined impulse responses $h_{eq,m}(k_0, k_1, k_2)$ may serve as reference impulse responses $h_{eq,ref,m}(k_0, k_1, k_2)$ for determining the final filter coefficients of the Volterra filter circuit 16, as will be described in more detail below.

Alternatively to the time-domain technique described above, the filter coefficients of the Volterra filter circuit 16 can also be determined by a Pth order inverse technique in frequency domain.

First, equation (E.5) is formulated for the maximum order M=3, and the innermost summation is performed, resulting in $$Y(f/f_a) = H_1(f/f_a) \cdot X(f/f_a) + \quad (E.59)$$

$$\sum_{\alpha=0}^{N-1} H_2(\alpha, f/f_a - \alpha \bmod 1) \cdot X(\alpha) \cdot X(f/f_a - \alpha \bmod 1) +$$

$$\sum_{\beta_0=0}^{N-1} \sum_{\beta_1=0}^{N-1} H_3(\beta_0, \beta_1, f/f_a - \beta_0 - \beta_1 \bmod 1) \cdot$$

$$X(\beta_0) \cdot X(\beta_1) \cdot X(f/f_a - f/f_a - \beta_0 - \beta_1 \bmod 1).$$

The condition for the first order of the Volterra filter circuit 16 is $$Y(f/f_a) = H_{eq,1}(f/f_a) \cdot H_1(f/f_a) \cdot X(f/f_a) = X(f/f_a). \quad (E.60)$$

This immediately yields the following result for an arbitrary input signal spectrum $X(f/f_a)$:

$$H_{eq,1}(f/f_a) = \frac{1}{H_1(f/f_a)} \quad (E.61)$$

The condition for the second order of the Volterra filter circuit 16 is $$\sum_{\mu=0}^{N-1} H_{eq,2}(\mu, f/f_a - \mu \bmod 1) \cdot X(\mu) \cdot X(f/f_a - \mu \bmod 1) = \quad (E.62)$$

$$-H_{eq,1}(f/f_a) \cdot \sum_{\alpha=0}^{N-1} H_2(\alpha, f/f_a - \alpha \bmod 1) \cdot$$

$$[H_{eq,1}(\alpha) \cdot X(\alpha)] \cdot [H_{eq,1}(f/f_a - \alpha \bmod 1) \cdot X(f/f_a - \alpha \bmod 1)].$$

This yields the following result:

$$H_{eq,2}(f_0/f_a,f_1/f_a) = -H_{eq,1}(f_0/f_a + f_1/f_a \bmod 1) \cdot H_2(f_0/f_a,f_1/f_a) \cdot H_{eq,1}(f_0/f_a) \cdot H_{eq,1}(f_1/f_a). \quad (E.63)$$

For the third order of the Volterra filter circuit 16, the frequency-domain analogues of the terms given in equation (E.55) are determined. The result is $$T_{(1)} = -H_{eq,1}(f/f_a) \cdot \sum_{\beta_0=0}^{N-1} \sum_{\beta_1=0}^{N-1} H_3(\beta_0, \beta_1, f/f_a - \beta_0 - \beta_1 \bmod 1) \cdot \quad (E.64)$$

$$[H_{eq,1}(\beta_0) \cdot X(\beta_0)] \cdot [H_{eq,1}(\beta_1) \cdot X(\beta_1)] \cdot$$

$$[H_{eq,1}(f/f_a - \beta_0 - \beta_1 \bmod 1) \cdot X(f/f_a - \beta_0 - \beta_1 \bmod 1)],$$

$$T_{(2)} = -\sum_{\alpha=0}^{N-1} H_{eq,2}(\alpha, f/f_a - \alpha) \cdot$$

$$[X(\alpha) + T_{(5)}(\alpha)] \cdot [X(f/f_a - \alpha \bmod 1) + T_{(6)}(f/f_a - \alpha \bmod 1)]$$

$$T_{(6)}(f/f_a - \alpha \bmod 1) = \sum_{\beta=0}^{N-1} H_{eq,2}(\beta, f/f_a - \alpha - \beta \bmod 1) \cdot$$

$$[H_{eq,1}(\beta) \cdot X(\beta)] \cdot [H_{eq,1}(f/f_a - \alpha - \beta \bmod 1) \cdot X(f/f_a - \alpha - \beta \bmod 1)]$$

$$T_{(3)} = +\sum_{\alpha=0}^{N-1} H_{eq,2}(\alpha, f/f_a - \alpha) \cdot X(\alpha) \cdot X(f/f_a - \alpha)$$

$$T_{(4)} =$$

$$+\sum_{\alpha=0}^{N-1} H_{eq,2}(\alpha, f/f_a - \alpha) \cdot \left\{ \sum_{\beta_0=0}^{N-1} H_2(\beta_0, \alpha - \beta_0 \bmod 1) \cdot [H_{eq,1}(\beta_0) \cdot X(\beta_0)] \cdot \right.$$

$$\left. [H_{eq,1}(\alpha - \beta_0 \bmod 1) \cdot X(\alpha - \beta_0 \bmod 1)] \right\} \cdot$$

$$\left\{ \sum_{\beta_1=0}^{N-1} H_2(\beta_1, f/f_a - \alpha - \beta_1 \bmod 1) \cdot [H_{eq,1}(\beta_1) \cdot X(\beta_1)] \cdot \right.$$

$$\left. [H_{eq,1}(\beta_1, f/f_a - \alpha - \beta_1 \bmod 1) \cdot X(\beta_1, f/f_a - \alpha - \beta_1 \bmod 1)] \right\}$$

For the calculation of the transfer function $H_{eq,3}$ of the third order of the Volterra filter circuit 16, only product spectra $X(f_0/f_a) \cdot X(f_1/f_a) \cdot X(f_2/f_a)$ with three frequencies may contribute. It has turned out that terms that do not meet this condition completely cancel each other.

Accordingly, it holds $$T_{(2)} = -\sum_{\alpha=0}^{N-1} H_{eq,2}(\alpha, f/f_a - \alpha) \cdot T_{(5)} \cdot T_{(6)} = \quad (E.65)$$

$$-T_{(4)} - \sum_{\alpha=0}^{N-1} H_{eq,2}(\alpha, f/f_a - \alpha) \cdot X(\alpha) \cdot X(f/f_a - \alpha) = -T_{(3)}.$$

The result for the third order transfer function of the Volterra filter circuit 16 has two contributions, namely $H_{eq,3}^{(1)}$ and $H_{eq,3}^{(2)}$, which are given by $$H_{eq,3}^{(1)}(f_0/f_a, f_1/f_a, f_2/f_a) = -H_{eq,1}(f_0/f_a + f_1/f_a + f_2/f_a \bmod 1) \cdot \quad \text{(E.65)}$$

$$H_3(f_0/f_a, f_1/f_a, f_2/f_a) \cdot H_{eq,1}(f_0/f_a) \cdot H_{eq,1}(f_0/f_a) \cdot H_{eq,1}(f_2/f_a).$$

$$H_{eq,3}^{(2)}(f_0/f_a, f_1/f_a, f_2/f_a) =$$

$$-H_{eq,2}(f_0/f_a + f_1/f_a + f_2/f_a \bmod 1) \cdot H_{eq,2}(f_0/f_a, f_1/f_a) \cdot H_{eq,1}(f_2/f_a) -$$

$$H_{eq,2}(f_1/f_a + f_2/f_a \bmod 1, f_0/f_a) \cdot H_{eq,2}(f_1/f_a, f_2/f_a) \cdot H_{eq,1}(f_2/f_a).$$

The third order transfer function of the Volterra filter circuit 16 is then given by $$H_{eq,3}(f_0/f_a, f_1/f_a, f_2/f_a) = H_{eq,3}^{(1)}(f_0/f_a, f_1/f_a, f_2/f_a) + H_{eq,3}^{(2)}(f_0/f_a, f_1/f_a, f_2/f_a) \quad \text{(E.67)}$$

With the technique described in equations (E.59) to (E.67), reference transfer functions $H_{eq,ref,m}(f_0/f_a, \ldots, f_{m-1}/f_a)$ are determined in the frequency domain.

Alternatively, the reference transfer functions may be determined based on the reference impulse responses $h_{eq,ref,m}(k_0, k_1, k_2)$ by a Fourier transform.

The (final) filter coefficients $h_{eq,m}$ of the Volterra filter circuit 16 can then be determined by a minimum square technique as described in equations (E.38) to (E.47) applied to the reference transfer functions $H_{eq,ref,m}(f_0/f_a, \ldots, f_{m-1}/f_a)$.

Therein, a desired structure can be imposed on the filter coefficients $h_{eq,m}$, e.g. a memory polynomial structure, an extended memory polynomial structure, or otherwise pruned impulse responses.

With the spectral weighting function W, the spectral quality of the Volterra filter circuit 16 can be controlled. It has turned out that a particular high equalization accuracy for equalizing unwanted non-linear disturbances is achievable this way.

It is to be understood that while the representative method(s) above is described in the context of the single non-linear electronic component 12 causing the non-linear distortions, the method(s) can readily be applied to several non-linear electronic components and/or to a whole non-linear electronic system comprising several non-linear electronic components that are interconnected.

Accordingly, filter coefficients of the Volterra filter circuit 16 may be adapted such that the equalizer circuit 14 is configured to equalize the non-linear electronic system.

In other words, the Volterra filter circuit 16 processes the output signal y of the non-linear electronic component 12, thereby generating an equalized output signal $y_{eq}$ that corresponds to the output signal y of the non-linear electronic component 12, but with the non-linear distortions removed.

Figure 4:
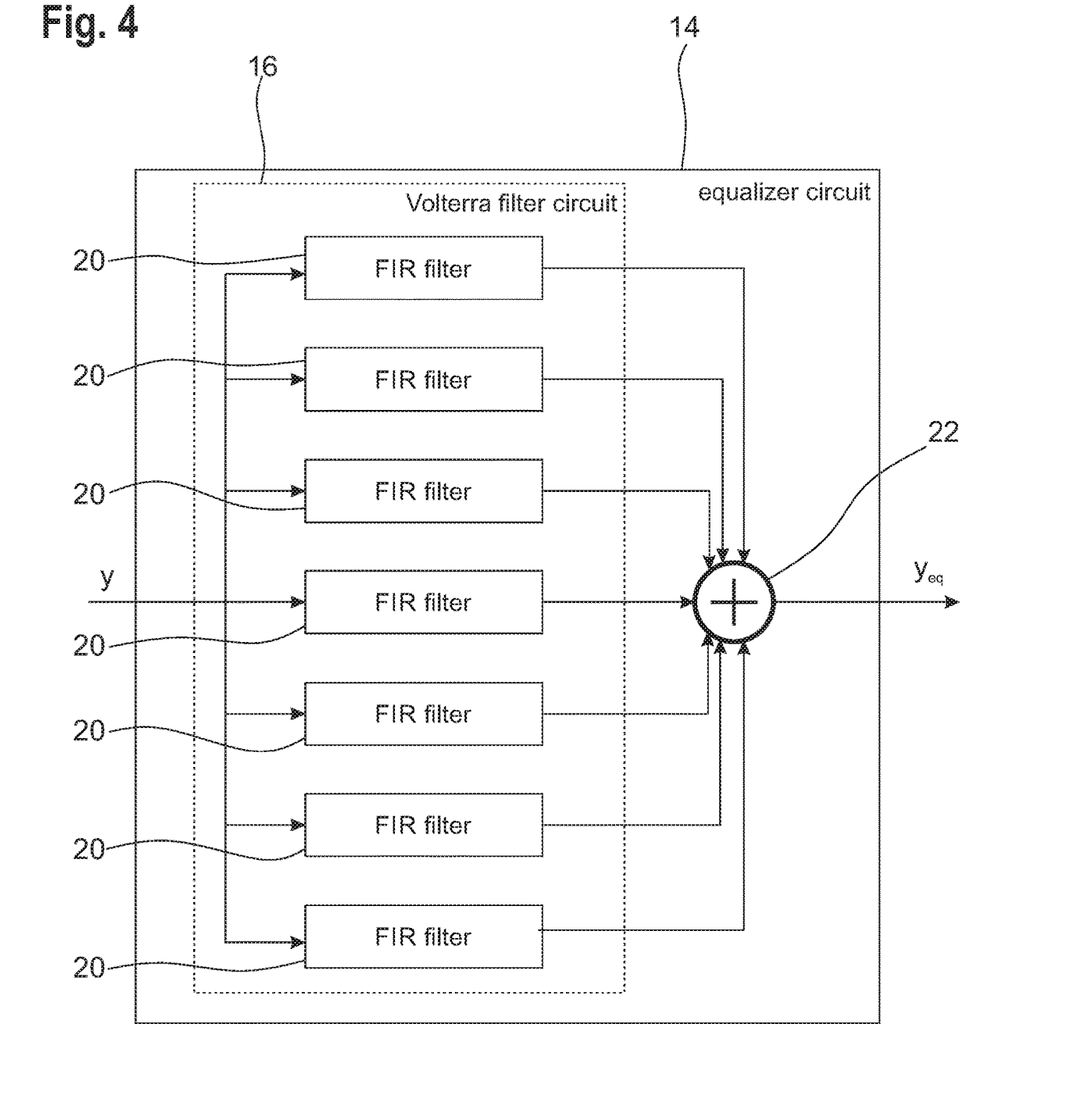
FIG. 4 schematically shows an implementation of an equalizer circuit according to an embodiment of the present disclosure.

FIG. 4 shows one possible implementation of the equalizer circuit 14 with the Volterra filter circuit 16. The equalizer circuit 14 is established, for example, as a digital filter circuit. The Volterra filter circuit 16 comprises several short-length finite impulse response (FIR) filters 20 that are arranged in parallel. The FIR filters 20 each are established in hardware. For example, the FIR filters 20 each may comprise FPGAs and/or ASICs.

Each of the short-length FIR filters 20 is configured to receive signal samples that are associated with the output signal y of the non-linear electronic component 12 (the output signal of the y of the non-linear electronic component 12 is the input signal of the equalizer circuit 14).

In the following, the output signal y of the non-linear electronic component is denoted as "filter input signal", and the equalized output signal $y_{eq}$ is denoted as "filter output signal".

Each short-length FIR filter 20 receives a product of at least two filter input signal samples, i.e. the filter input signal associated with each short-length FIR filter 20 comprises a product of at least two filter input signal samples, i.e. a product $$x(t_0/T_a - 0, \cdots, t_0/T_a - \mu_{m-1}) = \prod_{\alpha=0}^{m-1} x(t_0/T_a - \mu_\alpha). \quad \text{(E. 68)}$$

The short-length FIR filters 20 are each configured to determine one term of the second Volterra series as defined in equation (E.1) or (E.14), but with the impulse responses h being replaced by the determined filter coefficients $h_{eq}$.

Therein, different FIR filters 20 are associated with different diagonals of the second Volterra series.

In general, the number of necessary FIR filters 20 depends on the maximum order M of the second Volterra series and on the number of non-zero diagonals of the second Volterra series.

As already explained above, the maximum order of the second Volterra series is M=3.

For example, the second Volterra series may comprise $D_2=D_3=2$ non-zero diagonals. In this case, one FIR filter 20 is necessary for determining the first order (m=1) term of the second Volterra series. Two FIR filters 20 are necessary for determining the second order (m=2) term of the second Volterra series. Four FIR filters 20 are necessary for determining the third order (m=3) term of the third order Volterra series.

Thus, in the representative example shown in FIG. 4, the Volterra filter circuit 16 comprises seven FIR filters 20.

Each FIR filters 20 determines one term of the second Volterra series based on the filter input signal y and based on the filter coefficients $h_{eq}$. Thus, the output signal of each FIR filter 20 is associated with one term of the second Volterra series, i.e. with a certain diagonal of the second Volterra series.

The output signals of all FIR filters 20 are summed by a summation circuit 22, thereby generating the equalized output signal $y_{eq}$.

It has turned out that product signals as defined in equation (E.68) can be processed in a particularly resource-efficient manner by short-length FIR filters. Thus, the present disclosure provides a particularly resource-efficient equalizer circuit for equalizing non-linear systems.

In some embodiments, it has turned out that the equalizer circuit 14 described above is capable of equalizing the filter input signal y in real time, even at high sample rates up to several 10 GHz.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some embodiments, an equalizer circuit for equalizing a non-linear electronic system is provided. The equalizer circuit may comprise a Volterra filter circuit. In some embodiments, an electronic device comprises the equalizer circuit. In some embodiments, the equalization circuit is configured (e.g., programmed) to provide an input signal; process the input signal by the non-linear electronic system, thereby obtaining an output signal; providing a first mathematical model, wherein the first mathematical model describes the non-linear electronic system in terms of a first Volterra series; providing a second mathematical model, wherein the second mathematical model describes the Volterra filter circuit in terms of a second Volterra series; determining reference transfer functions of the Volterra filter circuit by a Pth order inverse technique based on the first Volterra series; and determining filter coefficients of the Volterra filter circuit based on the determined reference transfer functions and based on the second Volterra series. In other embodiments, the equalization circuit is configured (e.g., programmed) to carry out any one of the appended method claims.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of determining filter coefficients of an equalizer circuit for equalizing a non-linear electronic system, wherein the equalizer circuit comprises a Volterra filter circuit, and wherein the method comprises the following steps:
   providing an input signal;
   processing the input signal by the non-linear electronic system, thereby obtaining an output signal;
   providing a first mathematical model, wherein the first mathematical model describes the non-linear electronic system in terms of a first Volterra series;
   providing a second mathematical model, wherein the second mathematical model describes the Volterra filter circuit in terms of a second Volterra series;
   determining reference transfer functions of the Volterra filter circuit by a Pth order inverse technique based on the first Volterra series; and
   determining filter coefficients of the Volterra filter circuit based on the determined reference transfer functions and based on the second Volterra series,
   wherein the filter coefficients of the Volterra filter circuit are pruned such that frequency superpositions of contributions from different input signal frequencies contributing to the same output signal frequency are reduced;
   wherein the filter coefficients of the Volterra filter circuit are determined based on the determined reference transfer functions via a least squares method,
   wherein a cost function $K=\overline{E}^2$ is provided, wherein the cost function describes a spectral error signal power $\overline{E}^2$ in dependence of the reference transfer functions, wherein the cost function comprises a spectral weighting function $\underline{W}$, and wherein the cost function is minimized in order to determine the filter coefficients of the Volterra filter circuit,
   wherein the cost function is given by $K=[\underline{X}\cdot\underline{h}_{eq}-\underline{y}_{eq}]^T\cdot\text{diag}\{\underline{W}\}\cdot[\underline{X}\cdot\underline{h}_{eq}-\underline{y}_{eq}]$,
   wherein $\underline{X}$ is a matrix comprising exponential functions of the respective Fourier transforms, wherein $\underline{y}_{eq}$ is a reference vector comprising the reference transfer functions, and wherein $\underline{h}_{eq}$ is a vector comprising the filter coefficients of the Volterra filter circuit.

2. The method of claim 1, wherein an order of the first Volterra series and/or an order of the second Volterra series is smaller than or equal to three.

3. The method of claim 1, wherein transfer functions or impulse responses of the non-linear electronic system are determined based on the input signal, the output signal, and the first Volterra series, wherein the reference transfer functions of the Volterra filter circuit are determined based on the determined transfer functions or impulse responses of the non-linear electronic system.

4. The method according to claim 3, wherein the reference transfer functions of the Volterra filter circuit are obtained by a Pth order inverse technique in frequency domain or in time domain.

5. The method according to claim 1, wherein the input signal is a multi-frequency signal, wherein the multi-frequency signal comprises several different signal components having a different predefined frequency, respectively.

6. The method of claim 5, wherein the multi-frequency signal comprises at least three different signal components.

7. The method of claim 5, wherein the predefined frequencies are chosen such that frequency superpositions are reduced.

8. The method according to claim 1, wherein the first Volterra series is determined based on the input signal and the output signal.

9. An equalizer circuit for equalizing a non-linear electronic system, wherein the equalizer circuit comprises a Volterra filter circuit, and wherein filter coefficients of the Volterra filter circuit are determined by a method according to claim 1.

10. An electronic device, comprising an equalizer circuit according to claim 9.

11. The electronic device of claim 10, wherein the electronic device is established as at least one of a measurement instrument, a broad-band amplifier, an analog-to-digital converter, a digital-to-analog converter, and a signal generator.

12. The electronic device of claim 10, wherein the electronic device is established as an oscilloscope.

\* \* \* \* \*